United States Patent
Massonnat

(10) Patent No.: US 10,545,262 B2
(45) Date of Patent: Jan. 28, 2020

(54) METHOD FOR DETERMINING A PROPORTION CUBE

(71) Applicant: TOTAL SA, Courbevoie (FR)

(72) Inventor: Gérard Massonnat, Idron (FR)

(73) Assignee: TOTAL SA, Courbevoie (FR)

( * ) Notice: Subject to any disclaimer, the term of this patent is extended or adjusted under 35 U.S.C. 154(b) by 246 days.

(21) Appl. No.: 15/531,674

(22) PCT Filed: Nov. 28, 2014

(86) PCT No.: PCT/FR2014/053085
§ 371 (c)(1),
(2) Date: May 30, 2017

(87) PCT Pub. No.: WO2016/083675
PCT Pub. Date: Jun. 2, 2016

(65) Prior Publication Data
US 2017/0336531 A1    Nov. 23, 2017

(51) Int. Cl.
*G01V 99/00* (2009.01)
*G06F 17/50* (2006.01)

(52) U.S. Cl.
CPC ........ *G01V 99/005* (2013.01); *G06F 17/5009* (2013.01); *G01V 2210/1299* (2013.01); *G01V 2210/665* (2013.01)

(58) Field of Classification Search
None
See application file for complete search history.

(56) References Cited

U.S. PATENT DOCUMENTS

| 2006/0052938 A1* | 3/2006 | Thorne | G01V 1/30 702/11 |
| 2006/0053136 A1* | 3/2006 | Ashiri | G06F 16/2465 |
| 2011/0231164 A1* | 9/2011 | Zhang | G01V 99/005 703/2 |

OTHER PUBLICATIONS

International Search Report PCT/FR2014/053085, dated Aug. 4, 2015, 4 pages.
English translation of International Search Report PCT/FR2014/053085, dated Aug. 4, 2015, 3 pages.
Written Opinion for PCT/FR2014/053085, dated Aug. 4, 2015, 6 pages.
English translation of Written Opinion for PCT/FR2014/053085, dated Aug. 4, 2015, 5 pages.

(Continued)

*Primary Examiner* — Suzanne Lo
(74) *Attorney, Agent, or Firm* — Patterson Thuente Pedersen, P.A.

(57) ABSTRACT

A method and a device for determining geological facies in subsoil for oil and gas exploration. The method determines a combined proportion cube from a first meshed proportion cube and a second meshed proportion cube. The invention combines some facies models giving vertical probabilities and some facies models giving horizontal probabilities. This determination is particularly efficient in the presence of a zero probability in one of these models and is capable of respecting the mathematical constraint according to which the sum of each row and each column in the final proportion model must be equal to a predetermined maximum value.

4 Claims, 4 Drawing Sheets

(56) References Cited

OTHER PUBLICATIONS

Caers J et al: "Probabilistic integration of geologic scenarios, seismic, and production data a West Africa turbidite reservoir case study", The Leading Edge, Society of Exploration Geophysicists, US, Mar. 1, 2006 (Mar. 1, 2006), pp. 240-244, XP007902734, ISSN: 1070-485X, DOI: 10.1190/1.2184087.
Beucher H et al: "Using 3D seismic-derived information in lithofacies simulations. A case study", SPE Annual Technical Conference and Exhibition, XX, XX, vol. OMEGA, Oct. 3, 1999 (Oct. 3, 1999), pp. 581-592, XP002465166.

* cited by examiner

METHOD FOR DETERMINING A PROPORTION CUBE

This invention relates to the domain of determining geological facies in subsoil in the framework of exploration and exploitation of oil and/or gas.

It is useful to determine geological facies in a given field for exploration and exploitation of oil and/or gas because this determination can be used to make the best possible estimate of available resources and consequently the economic value of the field.

Furthermore, this determination can be used to produce detailed models for future production from the field depending on well parameters.

There are thus many techniques for example for creating facies models based for example on:
boreholes,
seismic images,
karstic simulations,
geostatistical simulations,
conceptual knowledge of geologists (e.g. facies gradient in a direction in space),
etc.

These techniques can be combined to obtain more precise results.

Since the proportions of the final model can have an influence on the calculation of oil or gas resources, geologists take care to monitor these proportions.

For example it may be required to combine some facies models that give vertical probabilities (or vertical trends) (VPC—"Vertical Proportion Cube") and some facies models that give horizontal probabilities (or horizontal trends) (HPC—"Horizontal Proportion Cube").

Facies models that model n facies are often composed of n proportion cubes, in which each cube is associated with one facies. For one mesh of the model, the sum of the proportions of the different facies (indicated by a corresponding mesh in their associated proportion cube) is equal to 1.

At the present time, there is no efficient solution in the state of the art for making such a comparison. Although solutions can be envisaged to combine two different probability models (e.g. HPC models and VPC models), the presence of a single zero probability in one of these models usually results in a zero probability in the final probability model, which can be a problem or can introduce a bias.

It can also be difficult once HPC models and VPC models have been combined to respect the mathematical constraint by which the sum of each row and each column in the final proportion model must be equal to 1. Failure to respect this mathematical constraint can cause serious modelling errors.

There is thus a need for a method of combining HPC and VPC models that gives satisfactory geological and mathematical results.

This invention improves this situation.

This invention aims at a method of determining a combined proportion cube from a first meshed proportion cube and a second meshed proportion cube for each facies i of a geological model, where i is an integer between 1 and I.

Each combined proportion cube, each first meshed proportion cube or each second meshed proportion cube comprises columns (105, 106) and each column comprises cells j (103, 104, 107, 108) in the column, where j is an integer between 1 and J.

The method includes the following steps for each current facies i among the facies taken in increasing order of i:
receive a first meshed proportion cube;
receive a second meshed proportion cube;
for each current column of the combined proportion cube for said current facies:
calculate a first value that is a function of a sum of proportion values associated with the cells of a column in said first cube corresponding to the current column;
calculate a second value that is a function of a sum of proportion values associated with the cells of a column in said second cube corresponding to the current column;
if the first value is less than or equal to the second value, associate a proportion value with each current cell j among the cells in the current column taken in increasing order of j, this proportion value being the minimum among:
a difference between the first calculated value and the sum of proportion values associated with cells k in the current column, where k is an integer within the [1,j−1] interval;
a proportion value associated with a cell corresponding to the current cell in the second proportion cube;
a difference between a maximum predetermined value and a sum of proportion values associated with a corresponding cell for each combined proportion cube for a facies m where m is an integer within the [1,i−1] interval;
if the first value is larger than the second value, take each current cell j among the cells in the current column and associate a proportion value with it, as a function of the average of a proportion value associated with a cell corresponding to the current cell in the first proportion cube and a proportion value associated with a cell corresponding to the current cell in the second proportion cube.

Obviously, the index i of the facies can be assigned arbitrarily to each possible facies, provided that this indexing method is constant throughout execution of the process.

J represents the number of cells in a column.

In one embodiment of the invention, the method may also comprise the following steps for each current facies i among the facies taken in increasing order of i:
calculate a third value as a function of a difference between:
the second value;
and a sum of the proportion values associated with the cells in said current column;
if the third value is less than the first value, add a complementary value to the proportion value associated with each current cell j among the cells in the current column taken in increasing order of j, this complementary value being the minimum among:
a difference between the predetermined maximum value and the proportion value associated with the current cell
a difference between the third value and the sum of complementary values used for cell k, where k is an integer within the [1, j−1] interval;
if the third value is larger than the first value, take the proportion value associated with each current cell j among the cells in the current column and add a complementary value to it, as a function of the average of a proportion value associated with a cell corresponding to the current cell in the first proportion cube and a proportion value associated with a cell corresponding to the current cell in the second proportion cube.

Thus, this invention also aims at a device designed to implement the above method.

A computer program implementing all or part of the method described above installed on existing hardware is in itself advantageous.

Thus, this invention also aims at a computer program containing instructions for use of the method described above, when this program is executed by a processor.

This program can use any programming language (for example an object language or other), and be in the form of an interpretable source code, a partly compiled code or a completely compiled code.

FIG. 3, described in detail below, shows a flow chart of the general algorithm of such a computer program.

Other characteristics and advantages of the invention will become clear after reading the following description. This description is purely illustrative and should be read with reference to the appended drawings among which:

Figure 1A:
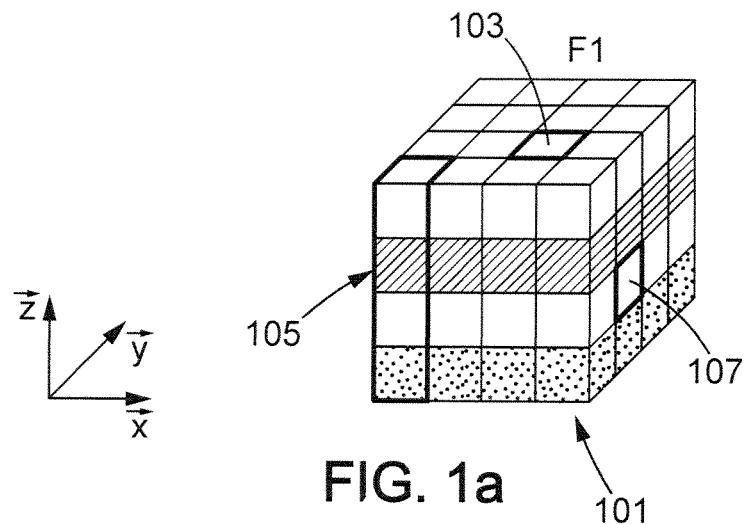
FIG. 1a and FIG. 1b illustrate input proportion cubes (giving vertical probability trends—VPC or giving horizontal probability trends—HPC)
Figure 1B:
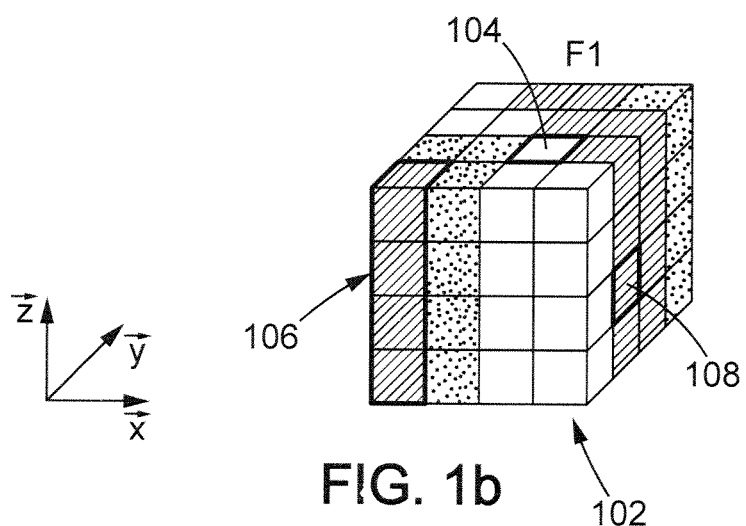
Figure 4:
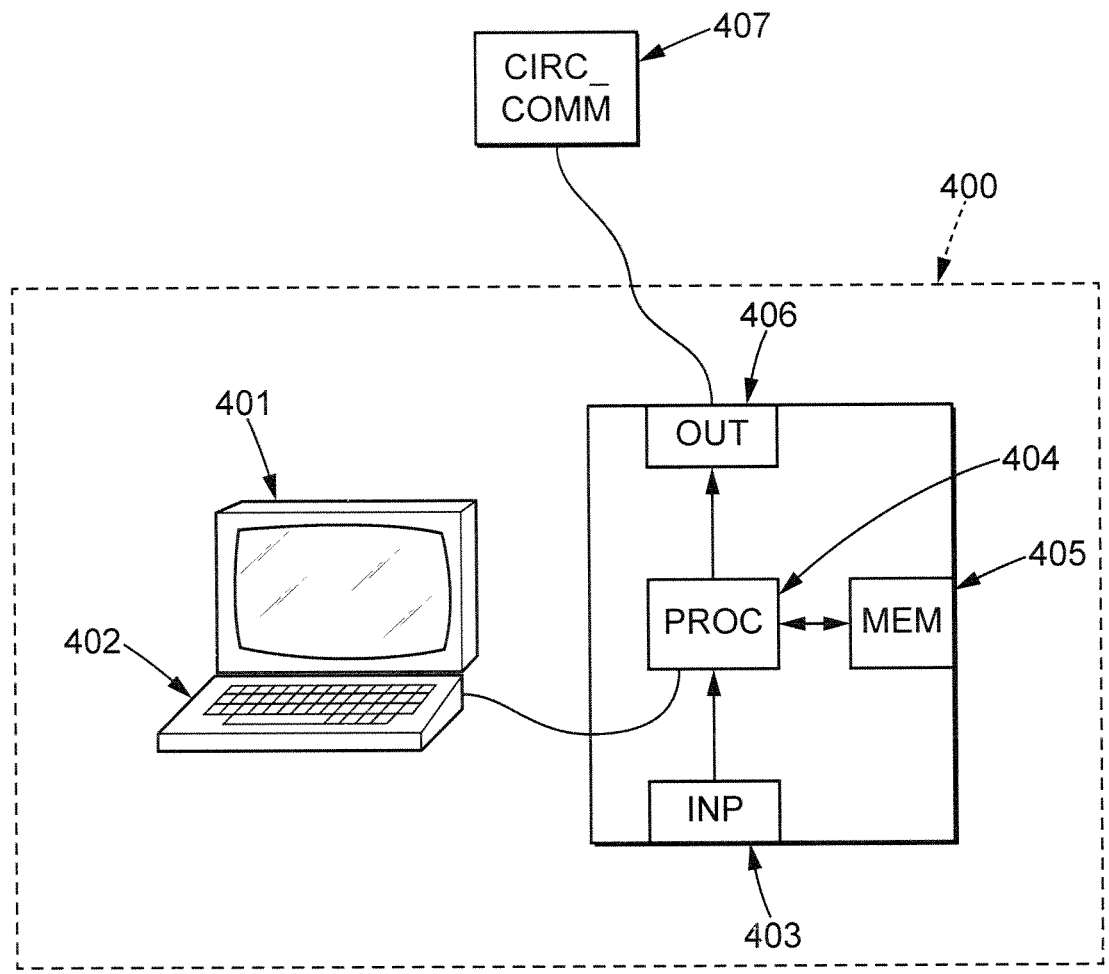

FIG. 4 describes a device capable of implementing an embodiment of the invention, FIG. 1a and FIG. 1b illustrate input proportion cubes (giving vertical probability trends—VPC or giving horizontal probability trends—HPC).

FIG. 1a illustrates a 4-cell×4-cell×4-cell proportion cube giving vertical proportion trends for the facies with index 1 (F1) in the model. This cube is called the VPC cube.

FIG. 1b illustrates a proportion cube with the same dimensions as the VPC cube giving horizontal proportion trends for the facies with index 1 (F1) in the model. This cube is called the HPC cube.

The VPC cube and the HPC cube have columns that can be made to correspond in pairs (i.e. those that have the same coordinates in the (x,y) plane, for example 105 and 106).

The combined cube is a cube (obtained by combining the HPC and VPC cubes) representing the final facies model and also having the same dimensions. It is thus also possible to define the corresponding columns in this combined cube and the HPC-VPC cubes in the same manner.

By analogy, the corresponding cells in the HPC cube and the VPC cube (or the combined cube) can be defined as two cells with the same coordinates in the (x,y,z) coordinate system. As an illustration, the cells 103 and 104 are corresponding (as are 107 and 108).

Figure 3:
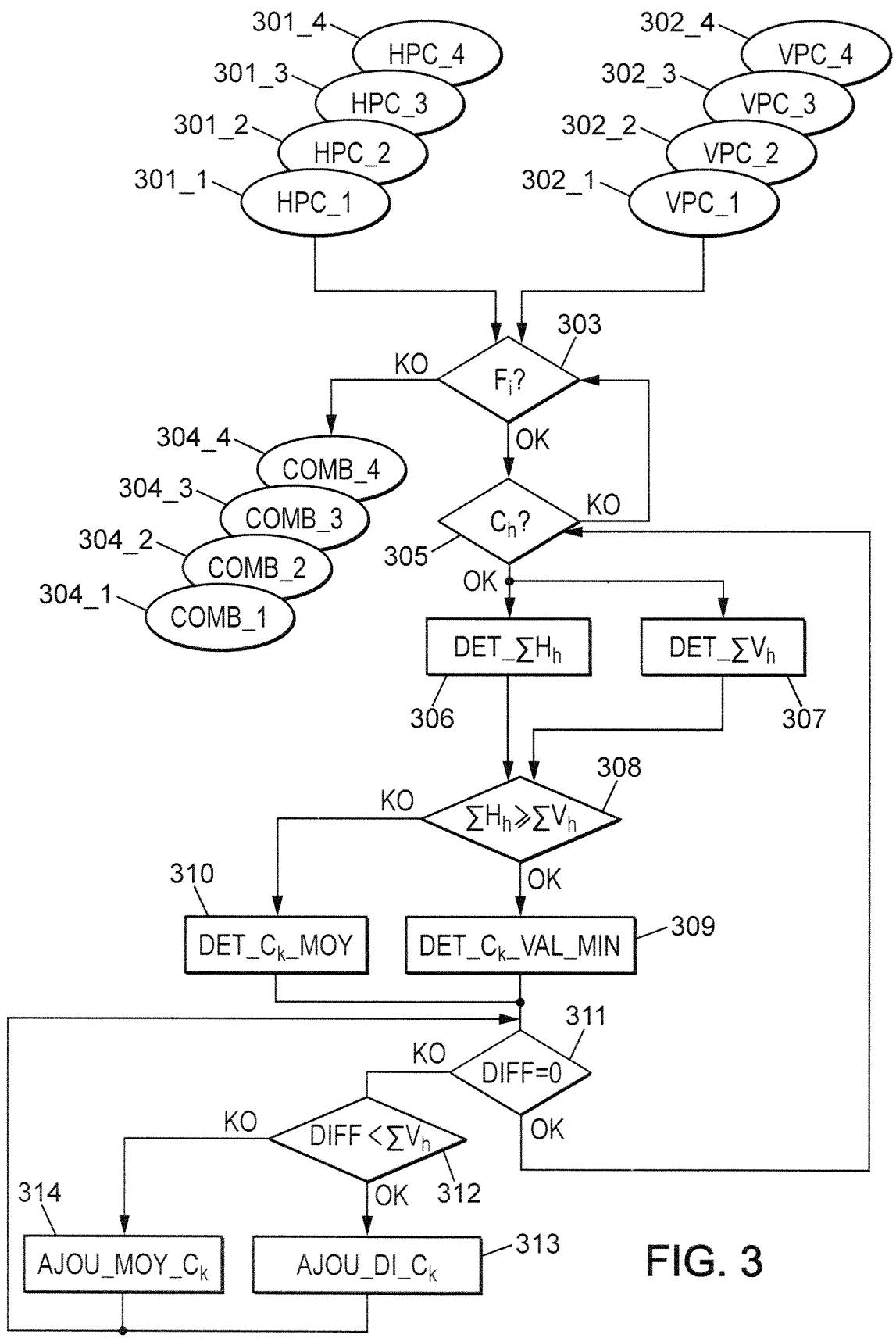
FIG. 3 illustrates a flow chart for one embodiment of the invention.

FIG. 3 illustrates a flow chart of one embodiment of the invention. In this embodiment, it is considered that the model may comprise four facies or four different types of facies. The facies can be identified by means of an index i between 1 and 4.

It is possible to receive a first meshed proportion cube (302_1, 302_2, 302_3, 302_4) and a second meshed proportion cube (301_1, 301_2, 301_3, 301_4), for each facies i.

If some of the facies among the facies 1 to 4 have not been processed (test 303, output OK), one of these unprocessed facies can be selected and the steps in the method described below can be performed for this facies i.

Otherwise (test 303, output KO), all the combined proportion curves (304_1, 304_2, 304_3, 304_4) can be returned, calculated as follows.

Once facies i has been selected, one column among the unprocessed columns for this facies in the combined proportion cube can be chosen (test 305, output OK). If all the columns in the combined proportion cube have been processed for this facies i (test 305, output KO), test 303 is re-executed.

Once a column h has been selected, a first value can be determined (step 307) as a function of a sum of proportion values associated with the cells in a column of the VPC code corresponding to the selected column h. This value can be equal to this sum.

A second value can also be calculated (step 306) as a function of a sum of proportion values associated with the cells of a column in said HPC cube corresponding to the current column. This value can be equal to this sum.

An example calculation of the first and second values is given below

Figure 2:
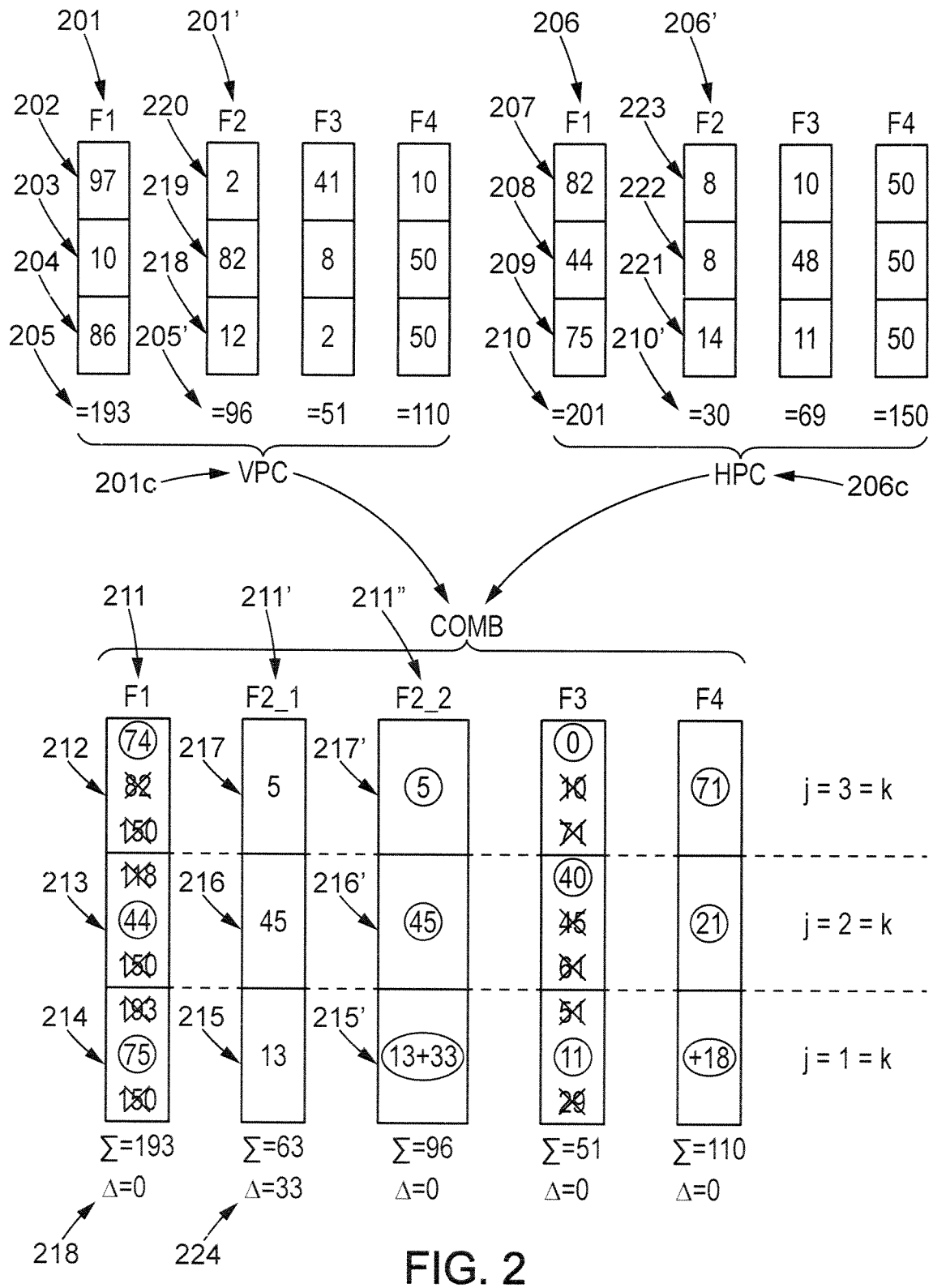
FIG. 2 illustrates a cube column for several facies to illustrate the different calculations of one embodiment of the invention.

With reference to FIG. 2, the four columns 201c are four corresponding columns of four VPC proportion cubes associated with four facies F1, F2, F3 and F4. Each column comprises three cells, each of which has one value. For example, column 201 comprises values 86 (element 204), 10 (element 203) and 97 (element 202) (from bottom to top). The four columns 206c are four corresponding columns of four HPC proportion cubes associated with four facies F1, F2, F3 and F4. Each column comprises three cells, each of which has one value. For example, column 206 comprises values 75 (element 75), 44 (element 208) and 82 (element 207) (from bottom to top).

Assuming that the selected facies is F1 and that the columns corresponding to the selected column are columns 201 and 206 in the VPC and HPC proportion cubes, the first value can be the sum of the elements 202, 203 and 204 namely 193 (i.e. 97+10+86, element 205). Similarly, the second value can be the sum of the elements 207, 208 and 209 namely 201 (i.e. 82+44+75, element 210).

Assuming that the selected facies is F2 and that the columns corresponding to the selected column are columns 201' and 206' in the VPC and HPC proportion cubes, the first value can be 96 (i.e. 12+82+2, element 205). Similarly, the second value can be 30 (i.e. 14+8+8, element 210).

If the first value is less than or equal to the second value (which is the case for the situation presented above with facies F1) (test 308, output OK), a proportion value must be associated (step 309) with each current cell k among the cells in the selected column (element 211 in FIG. 2 for facies F1) in the combined proportion cube taken in increasing order of j (i.e., with reference to FIG. 2, from the lowest cell in the column to the highest level), equal to the minimum value among:

a=a difference between the first calculated value (i.e. 193 with reference to FIG. 2 for facies 1) and the sum of the proportion values associated with cells k in the current column, where k is an integer within the [1, j−1] interval (i.e. the sum of the values of cells under the current cell k);

b=the proportion value associated with a cell corresponding to the current cell in the HPC proportion cube;

c=a difference between a predetermined maximum value (i.e. the maximum value of the cell, for example 1 or 100) and a sum of proportion values associated with a corresponding cell for each combined proportion cube of a facies m where m is an integer within the [1,i−1] interval (in other words for all corresponding cells of combined cells with a previously processed facies).

For example, in the example given above for facies F1 and with reference to FIG. 2, cell 214 in column 211 of the combined proportion cube for facies F1 is assigned three values a, b, c with a=193 (because there is no cell under this cell 214 in column 211), with b=75 (because the corresponding cell 209 in the HPC cube for facies F1 is also equal to this value) and c=150 (because it is assumed herein that the maximum predetermined value is equal to 150, since no other facies has been processed). In this case the minimum value among a, b and c is b. Thus, the value 75 is associated with cell 214.

Cell 213 in column 211 in the combined proportion cube for facies F1 is assigned three values a, b, c with a=118 (i.e. 193-75 because the value 193 is the first calculated value and the value 75 was assigned to cell 214 located under the cell 213), with b=44 (because the corresponding cell 208 in the HPC cube for facies F1 is also equal to this value) and c=150 (because it is assumed herein that the maximum predetermined value is equal to 150, since no other facies has been processed). In this case the minimum value among a, b and c is b. Thus, the value 44 is associated with cell 213.

Cell 212 in column 211 in the combined proportion cube for facies F1 is assigned three values a, b, c with a=74 (i.e. 193-75-44 because the value 193 is the first calculated value, the value 75 was assigned to cell 214, the value 44 was assigned to cell 213, cells 214 and 213 being located under the cell 212), with b=82 (because the corresponding cell 207 in the HPC cube for facies F1 is also equal to this value) and c=150 (because it is assumed herein that the maximum predetermined value is equal to 150, since no other facies has been processed). In this case the minimum value among a, b and c is a. Thus, the value 74 is associated with cell 212.

If the first value is larger than the second value (which is the case for the situation presented above with facies F2) (test 308, output KO), take each current cell among the cells in the current column and associate (step 310) a proportion value with it, as a function of the average of a proportion value associated with a cell corresponding to the current cell in the first proportion cube and a proportion value associated with a cell corresponding to the current cell in the second proportion cube. The associated proportion value can be this average This average can also be multiplied by a factor C taken in the [0; 1] interval.

For example, in the example given above for facies F2 and with reference to FIG. 2, cell 215 in column 211' of the combined proportion cube for facies F2 will firstly be assigned the value 13 (average of the value 12 of the corresponding cell 218 and the value 14 of the corresponding cell 221).

Cell 216 in column 211' of the combined proportion cube for facies F2 will firstly be assigned the value 45 (average of the value 82 of the corresponding cell 219 and the value 8 of the corresponding cell 222).

Cell 217 in column 211' of the combined proportion cube for facies F2 will firstly be assigned the value 5 (average of the value 2 of the corresponding cell 220 and the value 8 of the corresponding cell 223).

A third value (DIFF) can also be calculated as a function of a difference between the second value and a sum of proportion values associated with cells of said current column.

For illustration and with reference to FIG. 2, this third value is equal to 0 (element 218) for facies F1. This third value is equal to 33 (element 224) for facies F2.

If this third value is equal to 0 (test 311, output OK), the column can be changed (i.e. return to test 305).

If this third value is not equal to 0 (test 311, output KO), an attempt can be made to modify values associated with cells in the current column of the combined proportion cube as follows.

If the third value is less than the second value (test 312, output OK), a complementary value can be added (step 313) to the proportion value associated with each current cell j among the cells in the current column taken in increasing order of j, this complementary value being the minimum among:
  d=a difference between the maximum predetermined value (i.e. 150 in the example in FIG. 2) and the proportion value associated with the current cell (i.e. previously associated cell);
  e=a difference between the third value and the sum of complementary values used for cell k, where k is an integer within the [1, j−1] interval (in other words the sum of complementary values for cells located below cell j).

In the example in FIG. 2, the values of column 211' are modified because the third calculated value is equal to 33 (element 224, i.e. not equal to 0 and more than the first value 205' that is equal to 96). For cell 215, the value d is equal to 150-13 and the value e is equal to 33-0. Thus, the value 13 associated with cell 215 in column 211' is transformed into the value 13+33 (element 215'), 33 being the minimum value among d and e.

For cell 216, the value d is equal to 150-45 and the value e is equal to 33-33. Thus, the value 45 associated with cell 216 in column 211' is transformed into the value 13+0 (element 216'), 0 being the minimum value among d and e.

For cell 217, the value d is equal to 150-5 and the value e is equal to 33-33-0. Thus, the value 5 associated with cell 217 in column 211' is transformed into the value 5+0 (element 217'), 0 being the minimum value among d and e.

If the third value is larger than the first value (test 312, output KO), it is possible to take the proportion value associated with each current cell j among the cells in the current column and to add a complementary value to it, as a function of the average of a proportion value associated with a cell corresponding to the current cell in the first proportion cube and a proportion value associated with a cell corresponding to the current cell in the second proportion cube.

FIG. 4 represents an example of a device that can be used to implement one embodiment of the invention.

In this embodiment, the device comprises a computer 400 comprising a memory 405 for the storage of instructions for implementing the method, received measurement data, and temporary data for performing the different steps in the method as described above.

The computer also comprises a circuit 404. For example this circuit can be:
  a processor capable of interpreting instructions in the form of a computer program, or
  an electronic board for which the steps in the method according to the invention are described in the hardware, or
  a programmable electronic chip FPGA ("Field-Programmable Gate Array").

This computer comprises an input interface 403 for the reception of measurement data, and an output interface 406 to supply the combined proportion cube to a processing device 407 (that can also be the device 400). Finally, the computer can also comprise a screen 401 and a keyboard 402, to facilitate interaction with a user. Obviously, the keyboard is optional, particularly for example in the case of a computer in the form of a touch-sensitive tablet.

Furthermore, the functional diagram shown on FIG. 3 is a typical example of a program, of which some instructions can be executed on the described equipment 400. FIG. 3 could be the flow chart for the general algorithm for a computer program to implement the invention.

Obviously, this invention is not limited to the embodiments described above as examples; it covers other variants. Other embodiments are possible.

For example, only four facies are considered in FIGS. 2 and 3, but these embodiments can easily be generalised to include a smaller or larger number of facies.

The invention claimed is:

1. A method of determining a combined proportion cube from a first meshed proportion cube and a second meshed proportion cube for each facies i of a geological model, said geological model having a plurality of facies, where i is an integer between 1 and I, each combined proportion cube, each first meshed proportion cube or each second meshed proportion cube comprises columns and each column comprises cells j in the column, where j is an integer between 1 and J, the method including the following steps for each current facies i among the plurality of facies taken in increasing order of i:
receiving a first meshed proportion cube;
receiving a second meshed proportion cube having same dimensions as the first meshed proportion cube;
defining a combined proportion cube, having the same dimensions as the second meshed proportion cube, a correspondence existing between each column of the combined proportion cube and each column of the first meshed proportion cube, a correspondence existing between each column of the combined proportion cube and each column of the second meshed proportion cube;
for each current column of the combined proportion cube for said current facies:
calculating a first value that is a function of a sum of proportion values associated with the cells of a column in said first cube corresponding to the current column;
calculating a second value that is a function of a sum of proportion values associated with the cells of a column in said second cube corresponding to the current column;
if the first value is less than or equal to the second value, associating a proportion value with each current cell j among the cells in the current column taken in increasing order of j, this proportion value being the minimum among:
a difference between the first calculated value and the sum of proportion values associated with cells k in the current column, where k is an integer within an interval between [1, j−1];
a proportion value associated with a cell corresponding to the current cell j in the second proportion cube;
a difference between a predetermined value and a sum of proportion values associated with a corresponding cell for each combined proportion cube for a facies m where m is an integer within an interval between [1, i−1];
if the first value is larger than the second value, taking each current cell h among the cells in the current column and associating a proportion value with it, as a function of the average of a proportion value associated with a cell corresponding to the current cell h in the first proportion cube and a proportion value associated with a cell corresponding to the current cell h in the second proportion cube.

2. The method according to claim 1, in which the method also includes the following steps for each current facies i among the plurality of facies taken in increasing order of i and for each current column of the combined proportion cube for said current facies:
calculating a third value as a function of a difference between:
the second value;
and a sum of the proportion values associated with the cells in said current column;
if the third value is less than the first value, adding a complementary value to the proportion value associated with each current cell c among the cells in the current column taken in increasing order of j, said complementary value being the minimum among:
a difference between the predetermined value and the proportion value associated with the current cell c;
a difference between the third value and a sum of complementary values, the complementary values being the complementary values used for each cell k, for all integer values of k within an interval between [1, j−1];
if the third value is larger than the first value, taking the proportion value associated with each current cell b among the cells in the current column and adding a complementary value to it, as a function of the average of a proportion value associated with a cell corresponding to the current cell b in the first proportion cube and a proportion value associated with a cell corresponding to the current cell b in the second proportion cube.

3. A device for determining a combined proportion cube from a first meshed proportion cube and a second meshed proportion cube for each facies i of a geological model, said geological model having a plurality of facies, where i is an integer between 1 and I, wherein each combined proportion cube, each first meshed proportion cube or each second meshed proportion cube comprises columns and each column comprises cells j in the column, where j is an integer between 1 and J, the device comprising the following for each current facies i among the facies taken in increasing order of i:
a first interface for the reception of a first meshed proportion cube;
a second interface for the reception of a second meshed proportion cube having same dimensions as the first meshed proportion cube;
a circuit configured to define a combined proportion cube, having same dimensions as the second meshed proportion cube, a correspondence existing between each column of the combined proportion cube and each column of the first meshed proportion cube, a correspondence existing between each column of the combined proportion cube and each column of the second meshed proportion cube;
a circuit configured to perform the following, for each current column of the combined proportion cube for said current facies:
calculate a first value that is a function of a sum of proportion values associated with the cells of a column in said first cube corresponding to the current column;
calculate a second value that is a function of a sum of proportion values associated with the cells of a column in said second cube corresponding to the current column; wherein if the first value is less than or equal to the second value, associate a proportion value with each current cell j among the cells in the current column taken in increasing order of j, this proportion value being the minimum among:

a difference between the first calculated value and the sum of proportion values associated with cells k in the current column, where k is an integer within an interval between [1, j−1];

a proportion value associated with a cell corresponding to the current cell j in the second proportion cube;

a difference between a predetermined value and a sum of proportion values associated with a corresponding cell for each combined proportion cube for a facies m where m is an integer within an interval between [1, j−1]; and wherein if the first value is larger than the second value, take each current cell h among the cells in the current column and associate a proportion value with it, as a function of the average of a proportion value associated with a cell corresponding to the current cell in the first proportion cube and a proportion value associated with a cell corresponding to the current cell in the second proportion cube.

4. A non-transitory computer readable medium storing instructions for implementing the method according to claim 1, the instructions performing the method of claim 1 when executed by a processor.

* * * * *